(12) United States Patent
Lin

(10) Patent No.: US 11,959,939 B2
(45) Date of Patent: Apr. 16, 2024

(54) CHIP SOCKET, TESTING FIXTURE AND CHIP TESTING METHOD THEREOF

(71) Applicant: NANYA TECHNOLOGY CORPORATION, New Taipei (TW)

(72) Inventor: Shih-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 24 days.

(21) Appl. No.: 17/468,014

(22) Filed: Sep. 7, 2021

(65) Prior Publication Data

US 2023/0069959 A1    Mar. 9, 2023

(51) Int. Cl.
   *G01R 1/04*       (2006.01)
   *G01R 31/28*      (2006.01)
   (Continued)

(52) U.S. Cl.
   CPC ....... *G01R 1/0466* (2013.01); *G01R 31/2886* (2013.01); *G11C 29/56* (2013.01);
   (Continued)

(58) Field of Classification Search
   CPC .. G01R 1/0466; G01R 31/2886; G11C 29/56; H01L 23/32; H01L 23/49827; H01L 24/67; H01L 24/14; H01L 2224/1412; H01L 2224/67; H01L 2924/1436; H01R 12/7076; H01R 2201/20
   See application file for complete search history.

(56) References Cited

U.S. PATENT DOCUMENTS 5,442,642 A * 8/1995 Ingalls ............ G06F 11/267
                                              714/E11.169
5,702,255 A * 12/1997 Murphy ............ H05K 7/1061
                                              439/74
(Continued)

FOREIGN PATENT DOCUMENTS

JP   2001083207 A      3/2001
JP   2007078539 A  *   3/2007
(Continued)

OTHER PUBLICATIONS

Translation of JP-2001083207-A (Year: 2001).*
(Continued)

*Primary Examiner* — Paresh Patel
(74) *Attorney, Agent, or Firm* — Muncy, Geissler, Olds & Lowe, P.C.

(57) ABSTRACT

The present application discloses a chip socket, a testing fixture and a chip testing method thereof. The chip socket includes a pedestal, a plurality of conductive traces, a plurality of clamp structures, and a plurality of electrical contacts. The plurality of conductive traces are formed in the pedestal. The plurality of clamp structures are conductive and disposed on the first surface of the pedestal, and at least one of the plurality of clamp structures is coupled to a corresponding conductive trace and configured to clamp a solder ball of a chip to be tested. The plurality of electrical contacts are disposed on the second surface of the pedestal, and at least one of the plurality of electrical contacts is coupled to a corresponding clamp structure through a corresponding conductive trace.

17 Claims, 10 Drawing Sheets

(51) Int. Cl.
    *G11C 29/56*     (2006.01)
    *H01L 23/00*     (2006.01)
    *H01L 23/32*     (2006.01)
    *H01L 23/498*     (2006.01)
    *H01R 12/70*     (2011.01)

(52) U.S. Cl.
    CPC ........ *H01L 23/32* (2013.01); *H01L 23/49827* (2013.01); *H01L 24/67* (2013.01); *H01R 12/7076* (2013.01); *H01L 24/14* (2013.01); *H01L 2224/1412* (2013.01); *H01L 2224/67* (2013.01); *H01L 2924/1436* (2013.01); *H01R 2201/20* (2013.01)

(56) References Cited

U.S. PATENT DOCUMENTS

| | | | |
|---|---|---|---|
| 6,037,667 A * | 3/2000 | Hembree | H01L 23/49838 |
| | | | 257/781 |
| 6,045,416 A | 4/2000 | Sinclair | |
| 7,477,063 B1 * | 1/2009 | Wu | G01R 1/0483 |
| | | | 324/750.18 |
| 9,000,789 B2 * | 4/2015 | Kim | G01R 31/2851 |
| | | | 324/750.05 |
| 9,460,993 B2 * | 10/2016 | Shelsky | G01R 1/07371 |
| 2002/0195122 A1 * | 12/2002 | Hembree | G01R 1/0483 |
| | | | 15/207.2 |
| 2004/0044933 A1 * | 3/2004 | Jeddeloh | G11C 29/56 |
| | | | 714/718 |
| 2004/0188824 A1 * | 9/2004 | Akram | H01L 23/49827 |
| | | | 257/E21.597 |
| 2005/0260868 A1 | 11/2005 | Lee | |
| 2008/0007608 A1 | 1/2008 | Smith et al. | |
| 2011/0266539 A1 * | 11/2011 | Chey | G01R 1/06716 |
| | | | 257/E23.179 |

FOREIGN PATENT DOCUMENTS

| | | |
|---|---|---|
| TW | 564945 U | 12/2003 |
| TW | M487434 | 10/2014 |
| TW | M487434 U | 10/2014 |
| TW | 202035987 A | 10/2020 |
| TW | 202042609 A | 11/2020 |

OTHER PUBLICATIONS

Translation of JP-2007078539-A (Year: 2007).*
Taiwanese Office Action dated Jun. 21, 2023 in application No. 111104897 and the search report attached to the Office Action, pp. 1-11.

* cited by examiner

CHIP SOCKET, TESTING FIXTURE AND CHIP TESTING METHOD THEREOF

TECHNICAL FIELD

The present disclosure relates to a chip socket, and more particularly, to a chip socket for chip testing.

DISCUSSION OF THE BACKGROUND

After the semiconductor devices are manufactured, it is necessary to test electrical or functional characteristics of the newly-completed semiconductor devices so as to ensure that the semiconductor devices can meet the product specifications. For example, as bandwidth and speed of a dynamic random access memory (DRAM) increase, requirements for the receiver of the DRAM, such as the bit error rate (BER), also become more critical.

However, when a device under test (DUT) is soldered on the circuit board for testing, the DUT can be damaged easily, which may affect the characteristics or the performance of the DUT. Therefore, how to design a repeatable and stable socket fixture for chip testing has become an issue to be solved.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a chip socket. The chip socket comprises a pedestal, a plurality of conductive traces, a plurality of clamp structures, and a plurality of electrical contacts. The pedestal has a first surface and a second surface. The plurality of conductive traces are formed in the pedestal. The plurality of clamp structures are disposed on the first surface of the pedestal, and at least one of the plurality of clamp structures is coupled to a corresponding conductive trace of the plurality of conductive traces and configured to clamp a solder ball of a chip to be tested, wherein the plurality of clamp structures are conductive. The plurality of electrical contacts are disposed on the second surface of the pedestal, and at least one of the plurality of electrical contacts is coupled to a corresponding clamp structure of the plurality of clamp structures through a corresponding conductive trace of the plurality of conductive traces.

In some embodiments, a clamp structure of the plurality of clamp structures comprises a conductive body embedded in the pedestal, and a gap formed in a middle of the conductive body and surrounded by sidewalls of the conductive body. The sidewalls surrounding the gap are configured to clamp the solder ball of the chip to be tested.

In some embodiments, the conductive body is made of copper or silver.

In some embodiments, pitches of the plurality of clamp structures are compatible with a standard ball grid array (BGA) package defined by Joined Electron Device Engineering Council (JEDEC).

In some embodiments, a total quantity of the plurality of clamp structures is greater than or equal to a total quantity of balls of the standard ball grid array package.

Another aspect of the present disclosure provides a testing fixture. The testing fixture comprises a first circuit board and a chip socket. The chip socket is mounted on the first circuit board and comprises a pedestal, a plurality of conductive traces, a plurality of clamp structures, and a plurality of electrical contacts. The pedestal has a first surface and a second surface. The plurality of conductive traces are formed in the pedestal. The plurality of clamp structures are disposed on the first surface of the pedestal, and at least one of the plurality of clamp structures is coupled to a corresponding conductive trace of the plurality of conductive traces and configured to clamp a solder ball of a chip to be tested, wherein the plurality of clamp structures are conductive. The plurality of electrical contacts are disposed on the second surface of the pedestal, and at least one of the plurality of electrical contacts is coupled to a corresponding clamp structure of the plurality of clamp structures through a corresponding conductive trace of the plurality of conductive traces.

In some embodiments, a clamp structure of the plurality of clamp structures comprises a conductive body embedded in the pedestal, and a gap formed in a middle of the conductive body and surrounded by sidewalls of the conductive body. The sidewalls surrounding the gap are configured to clamp the solder ball of the chip to be tested.

In some embodiments, the conductive body is made of copper or silver.

In some embodiments, pitches of the plurality of clamp structures are compatible with a standard ball grid array (BGA) package defined by Joined Electron Device Engineering Council (JEDEC).

In some embodiments, a total quantity of the plurality of clamp structures is greater than or equal to a total quantity of balls of the standard ball grid array package.

In some embodiments, the testing fixture further comprises a second circuit board. The second circuit board comprises a slot. The first circuit board is attached to the slot as an inline memory module, and the chip to be tested is coupled to the second circuit through the first circuit board.

In some embodiments, the testing fixture further comprises a testing circuit mounted on the first circuit board and configured to test a dynamic random access memory circuit in the chip to be tested.

Another aspect of the present disclosure provides a chip testing method. The chip testing method comprises forming a chip socket comprising a plurality of clamp structures and a plurality of electrical contacts, mounting the plurality of electrical contacts of the chip socket on a first circuit board, attaching a first chip to the chip socket by clamping solder balls of the first chip with the plurality of clamp structures of the chip socket, and testing the first chip by sending signals to and receiving signals from the first chip through the first circuit board.

In some embodiments, forming the chip socket comprising the plurality of clamp structures and the plurality of electrical contacts comprises providing a pedestal, forming a plurality of conductive traces in the pedestal, forming the plurality of clamp structures on a first surface of the pedestal, and forming the plurality of electrical contacts on a second surface of the pedestal. At least one clamp structure of the plurality of clamp structures is coupled to a corresponding conductive trace of the plurality of conductive traces, and at least one of the plurality of electrical contacts is coupled to a corresponding clamp structure of the plurality of clamp structures through a corresponding conductive trace of the plurality of conductive traces.

In some embodiments, forming the plurality of clamp structures on the first surface of the pedestal comprises forming a conductive body embedded in the pedestal and forming a gap in a middle of the conductive body and surrounded by sidewalls of the conductive body. The sidewalls surrounding the gap are configured to clamp the solder ball of the first chip.

In some embodiments, pitches of the plurality of clamp structures are compatible with a standard ball grid array (BGA) package defined by Joined Electron Device Engineering Council (JEDEC).

In some embodiments, the chip testing method further comprises attaching a second chip to the chip socket with the first chip being attached on the chip socket, and testing the second chip by sending signals to and receiving signals from the second chip through the first circuit board. The first chip and the second chip are tested simultaneously or sequentially.

In some embodiments, the chip testing method further comprises attaching the first circuit board to a slot of a second circuit board as an inline memory module.

In some embodiments, the chip testing method further comprises detaching the first chip from the chip socket after the first chip is tested.

In some embodiments, the chip testing method further comprises attaching a second chip to the chip socket after the first chip is detached. A total quantity of balls of the first chip is different from a total quantity of balls of the second chip.

Since the chip socket, the testing fixture, and the chip testing method provided by the embodiments of the present embodiments can use clamp structures on the chip socket to clamp the solder balls of the chip to be tested, the chip to be tested can be attached to the circuit board for testing without being damaged. Furthermore, since the chip socket allows the chips to be attached and detached repeatedly, a repeatable and stable method for testing chip can be provided by the chip sockets and the testing fixtures of the present disclosure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
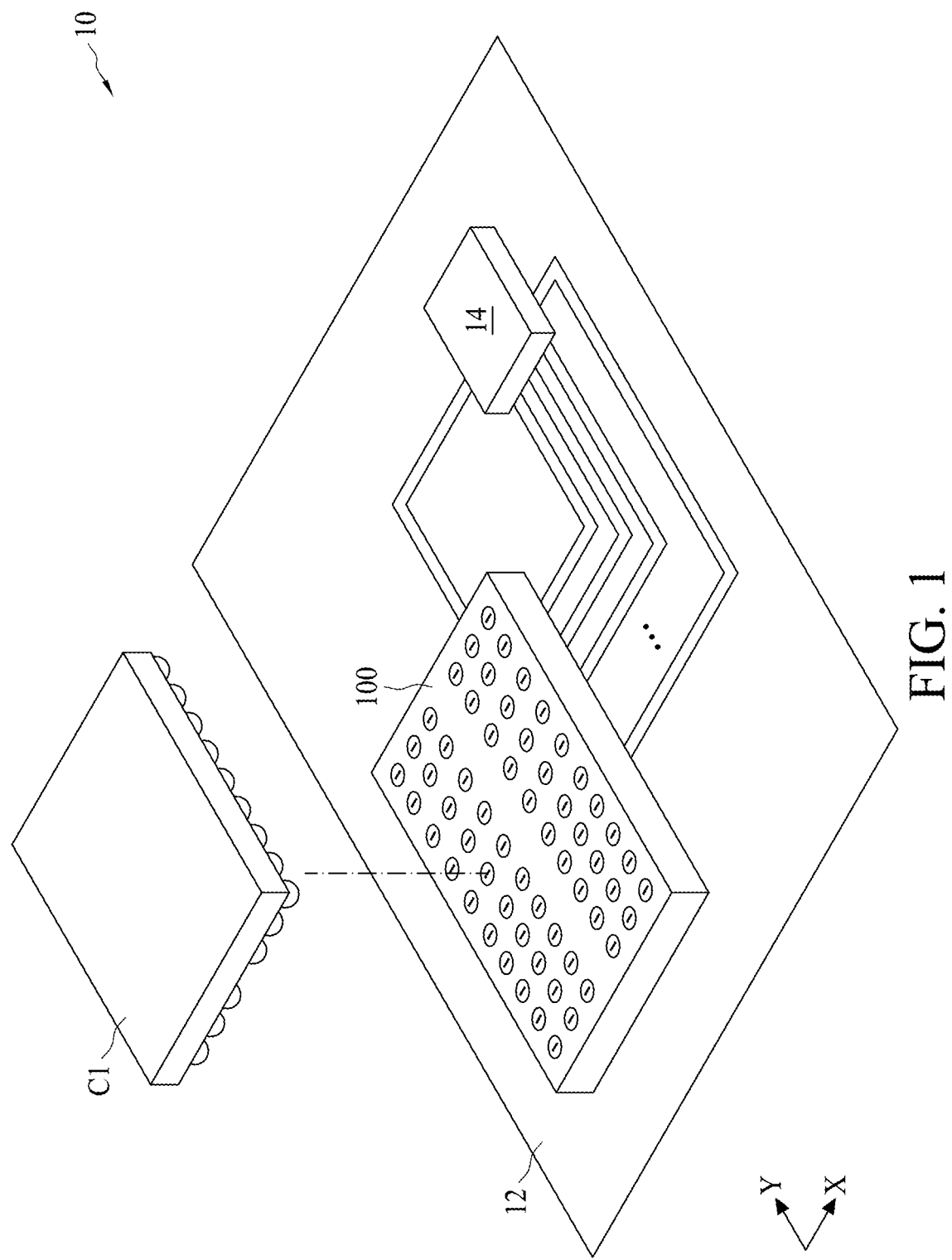
FIG. 1 shows a testing fixture according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

FIG. 1 shows a testing fixture 10 according to one embodiment of the present disclosure. The testing fixture 10 includes a circuit board 12 and a chip socket 100. The chip socket 100 is mounted on the circuit board 12. In the present embodiment, the chip socket 100 can receive and clamp the chip C1 so that the chip C1 can receive signals from and transmit signals to circuits on the circuit board 12 for testing purpose. For example, in some embodiments, the chip C1 may include a dynamic random access memory (DRAM) circuit, and the testing fixture 10 may further include a testing circuit 14 mounted on the circuit board 12. The testing circuit 14 can be used to generate signals to the chip C1 and collect signals generated by the chip C1 for testing the DRAM circuit in the chip C1. However, the present disclosure is not limited thereto. In some other embodiments, the chip C1 may include circuits of other functions, and the testing circuit 14 can be designed to test the chip C1 correspondingly.

Figure 2:
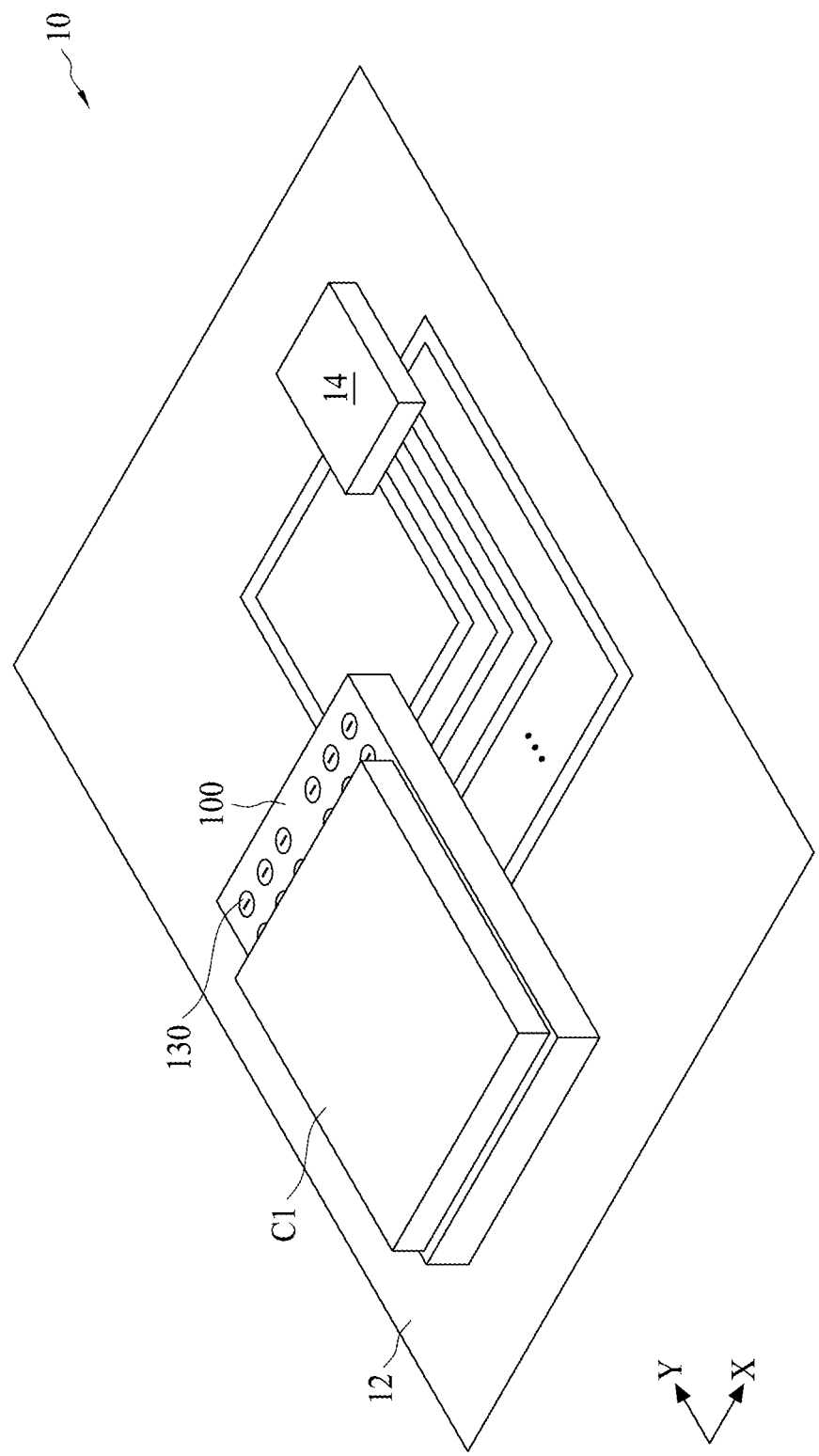
FIG. 2 shows a utilizing scenario with the chip attached to chip socket of the testing fixture in FIG. 1.

FIG. 2 shows a utilizing scenario with the chip C1 attached to chip socket 100 of the testing fixture 10. Since the chip C1 can be attached to the chip socket 100 with the clamping structures 130 of the chip socket 100, no soldering process for the chip C1 is needed. In such case, the possibility that the chip C1 is damaged during the soldering process for mounting the chip C1 to the circuit board 12 can be reduced. As a result, the testing result can be more consistent with the actual performance of the chip C1. Furthermore, after the chip C1 is tested, the chip C1 can be detached from the chip socket 100 so the chip socket 100 can receive and clamp another chip to be tested. That is, the chip socket 100 provides a repeatable and stable way of chip testing.

Figure 3:
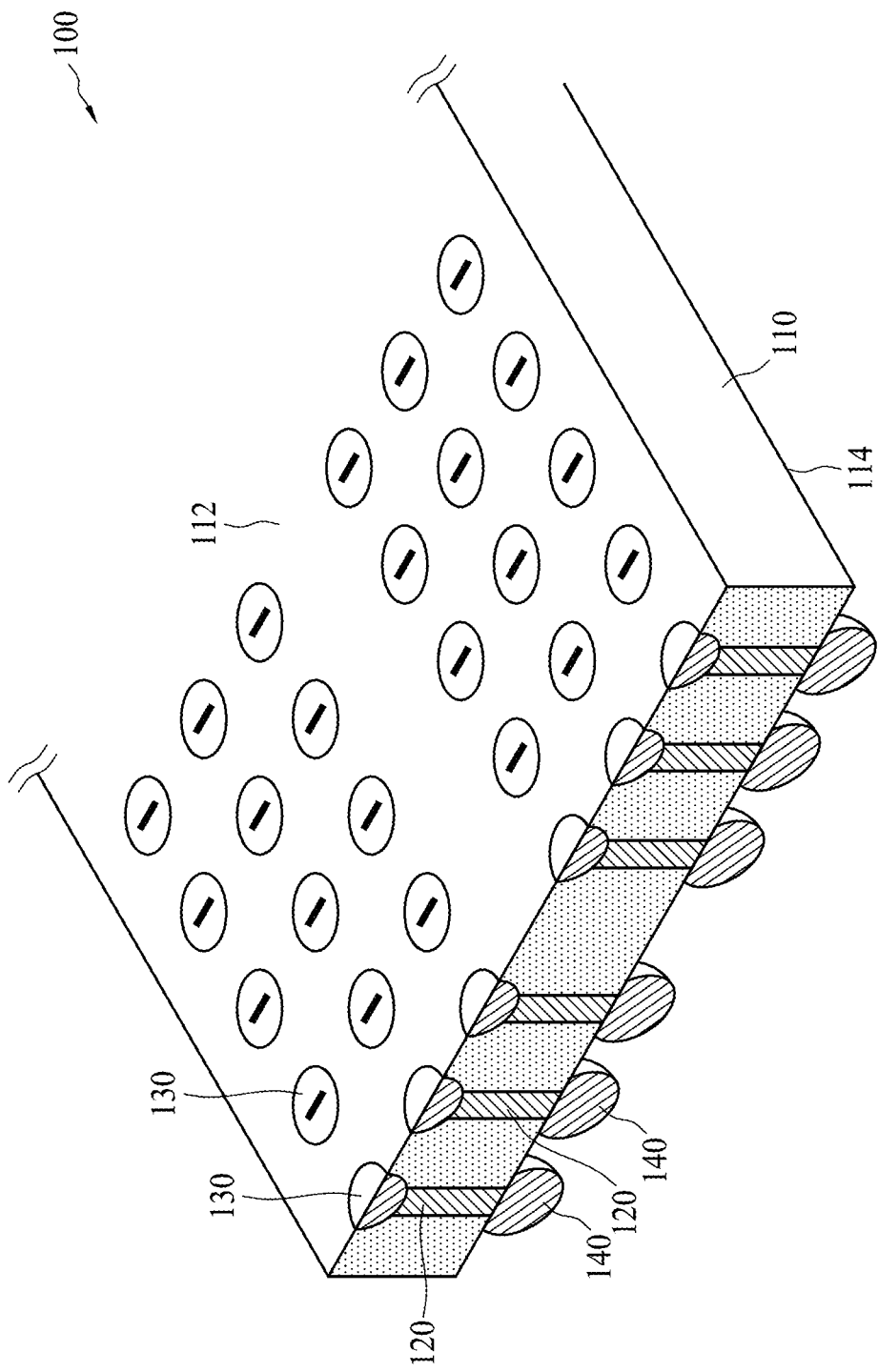
FIG. 3 shows a cross-sectional view of the chip socket in FIG. 1 according to one embodiment of the present disclosure.
Figure 4:
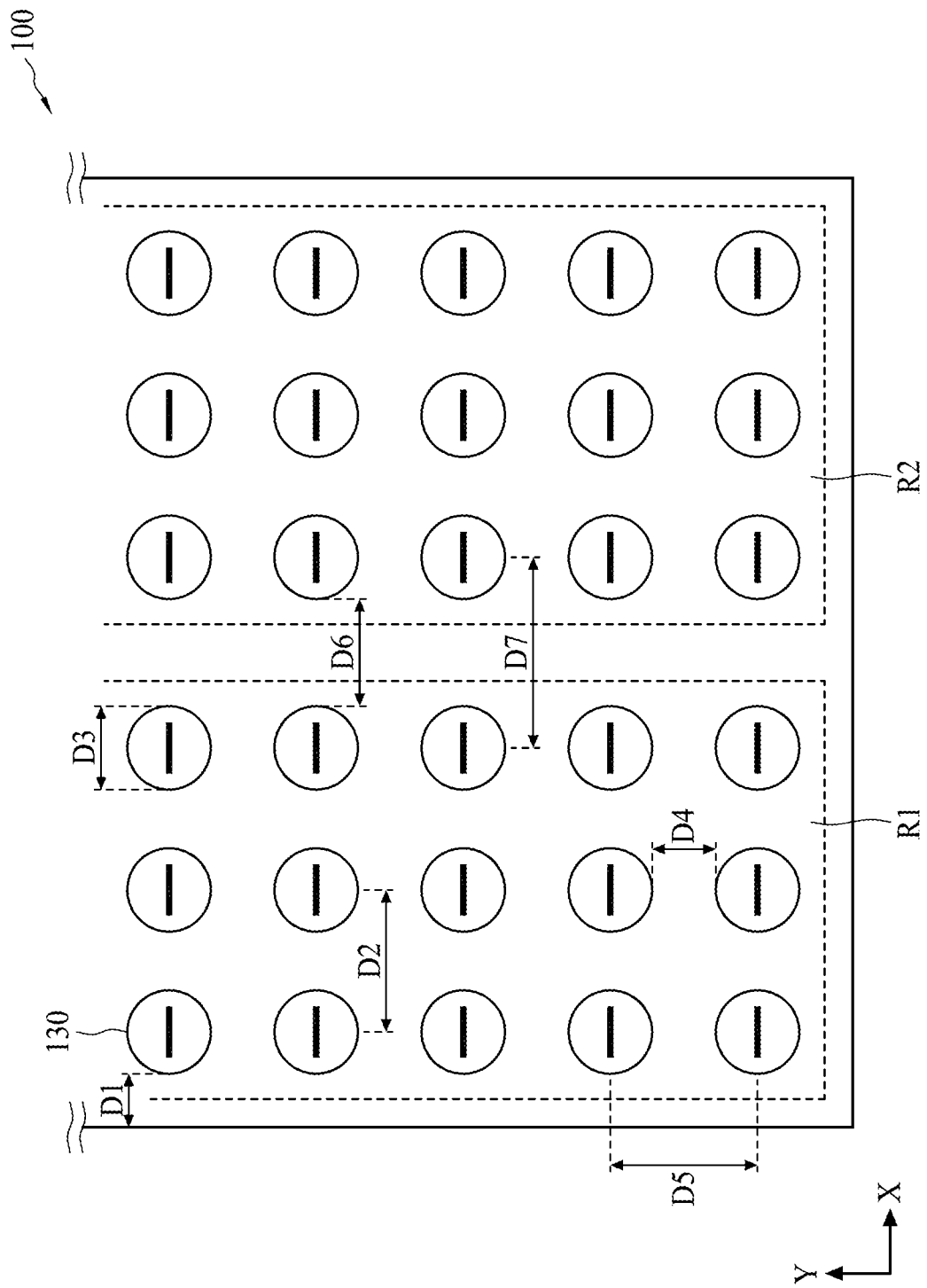
FIG. 4 shows a top view of the chip socket in FIG. 1.

FIG. 3 shows a cross-sectional view of the chip socket 100 according to one embodiment of the present disclosure, and FIG. 4 shows a top view of the chip socket 100. As shown in FIG. 3, the chip socket 100 includes a pedestal 110, a plurality of conductive traces 120, a plurality of clamp structures 130, and a plurality of electrical contacts 140.

The pedestal 110 has a first surface 112 and a second surface 114, and the conductive traces 120 can be formed in the pedestal 110. The clamp structures 130 are conductive and can be disposed on the first surface 112. In addition, the clamp structure 130 can be coupled to a corresponding conductive trace 120, and can be used to clamp a solder ball of the chip to be tested, such as the chip C1.

The electrical contacts 140 can be disposed on the second surface 114 of the pedestal 110, and the electrical contact 140 can be coupled to a corresponding clamp structure 130 through a corresponding conductive trace 120 in the pedestal 110. The electrical contacts 140 can be, for example, solder balls, pins, solder bumps or other types of contact bodies that allows the chip socket 100 to be installed on the circuit board 12. In such case, when the chip C1 is attached to the chip socket 100 as shown in FIG. 2, the chip C1 can be coupled to the circuits on the circuit board B1 through the clamp structures 130, the conductive traces 120 and the electrical contacts 140, and thus the chip C1 can be tested by the testing circuit 14 on the circuit board 12 accordingly.

Figure 5:
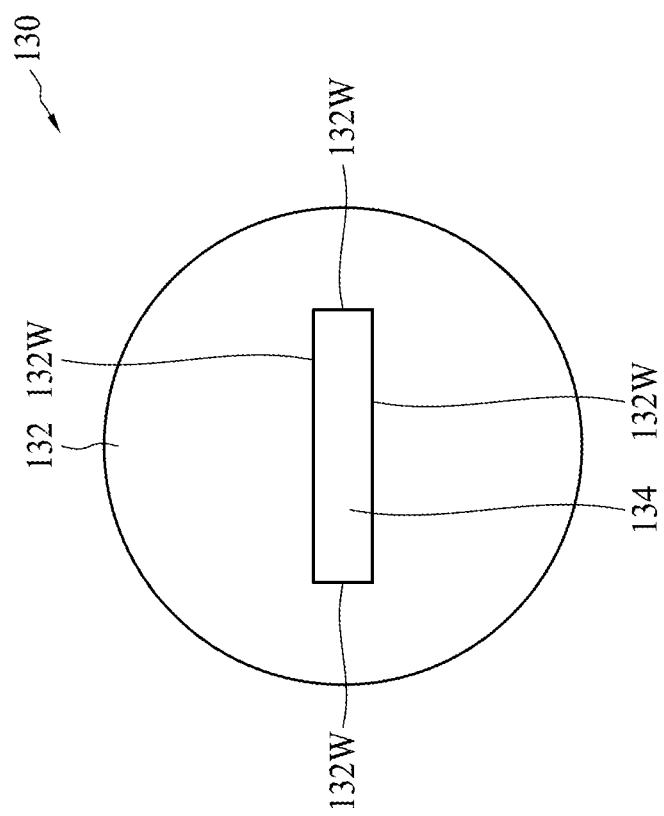
FIG. 5 shows a top view of the clamp structure according to one embodiment of the present disclosure.

FIG. 5 shows a top view of the clamp structure 130 according to one embodiment of the present disclosure. As shown in FIG. 5, the clamp structure 130 includes a conductive body 132 and a gap 134. In the present embodiment, the conductive body 132 can be embedded in the pedestal 110; however, the present disclosure is not limited thereto. In some other embodiments, the conductive body 132 can be disposed above the pedestal 110.

Figure 6:
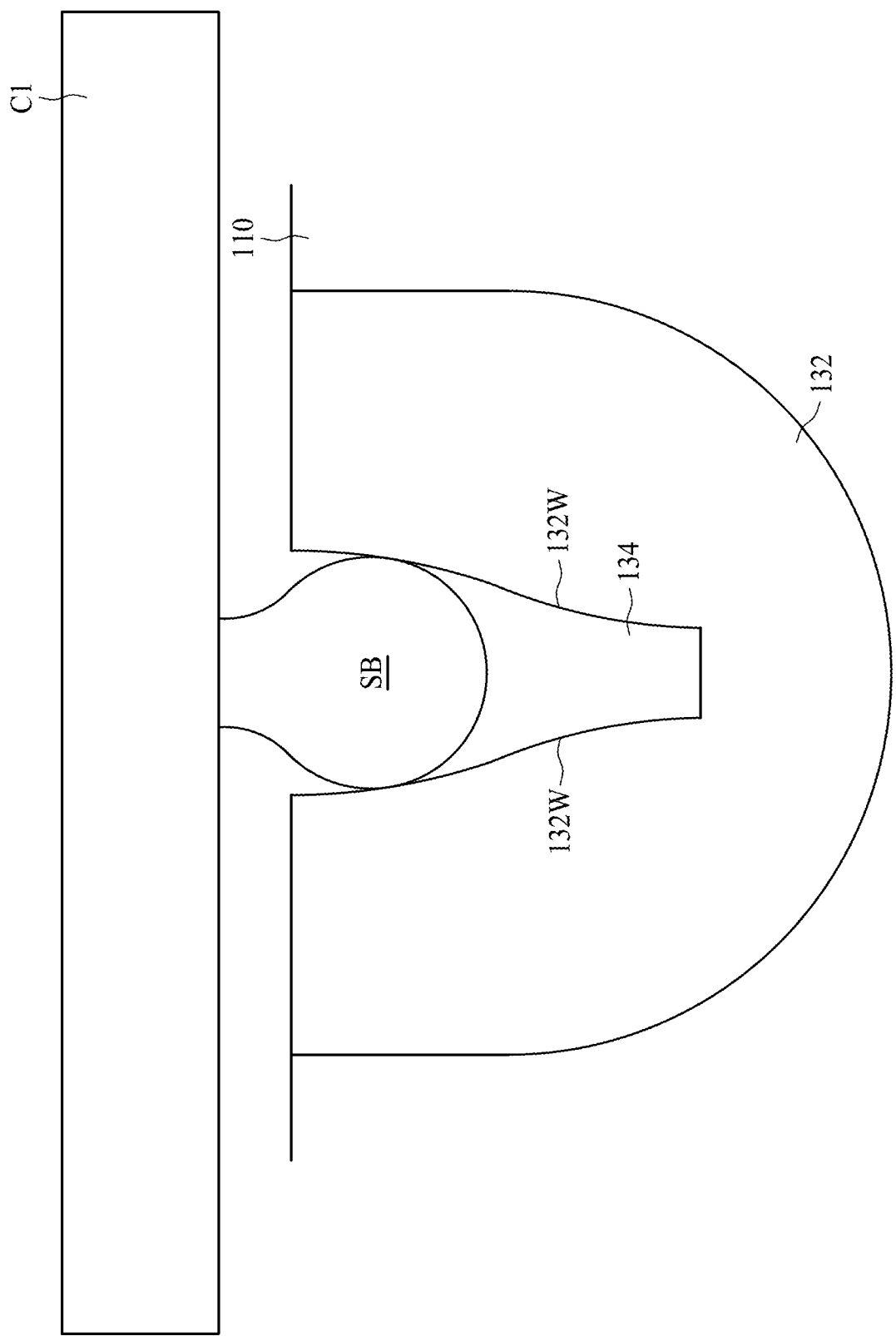
FIG. 6 shows the clamp structure clamping a solder ball of the chip.

Furthermore, the gap 134 is formed in a middle of the conductive body 132 and surrounded by sidewalls 132W of the conductive body 132. FIG. 6 shows the clamp structure 130 clamping a solder ball SB of the chip C1. As shown in FIG. 6, the sidewalls 132W surrounding the gap 134 can clamp the solder ball SB of the chip C1. In some embodiments, the conductive body 132 can be made of copper or silver. The copper and silver can provide not only great conductivity but also moderate ductility; therefore, solder balls can be inserted to or pulled from the gap 134 repeatedly.

In addition, although the gap 134 shown in FIG. 5 has a rectangular shape, the present disclosure is not limited thereto. In some other embodiments, the gap 134 may be formed with any other shapes that is suitable for accommodating the solder ball of the chip to be tested.

Furthermore, to ensure that the chip C1 can be attached to the chip socket 100 smoothly and stably, pitches of the clamp structures 130 should be designed to be compatible with the standard ball grid array (BGA) package defined by the Joined Electron Device Engineering Council (JEDEC). For example, as shown in FIG. 4, a distance D1 between an edge of the pedestal 110 and a boundary of a clamp structure 130 at a peripheral area, a distance D2 between centers of two adjacent clamp structures 130, and a diameter of the clamp structure 130 should all be within predetermined ranges defined by the JEDEC. Similarly, a minimum distance D4 between boundaries of two adjacent clamp structures 130 and a distance D5 between centers of two adjacent clamp structures 130 should also be within predetermined ranges defined by JEDEC.

Figure 7:
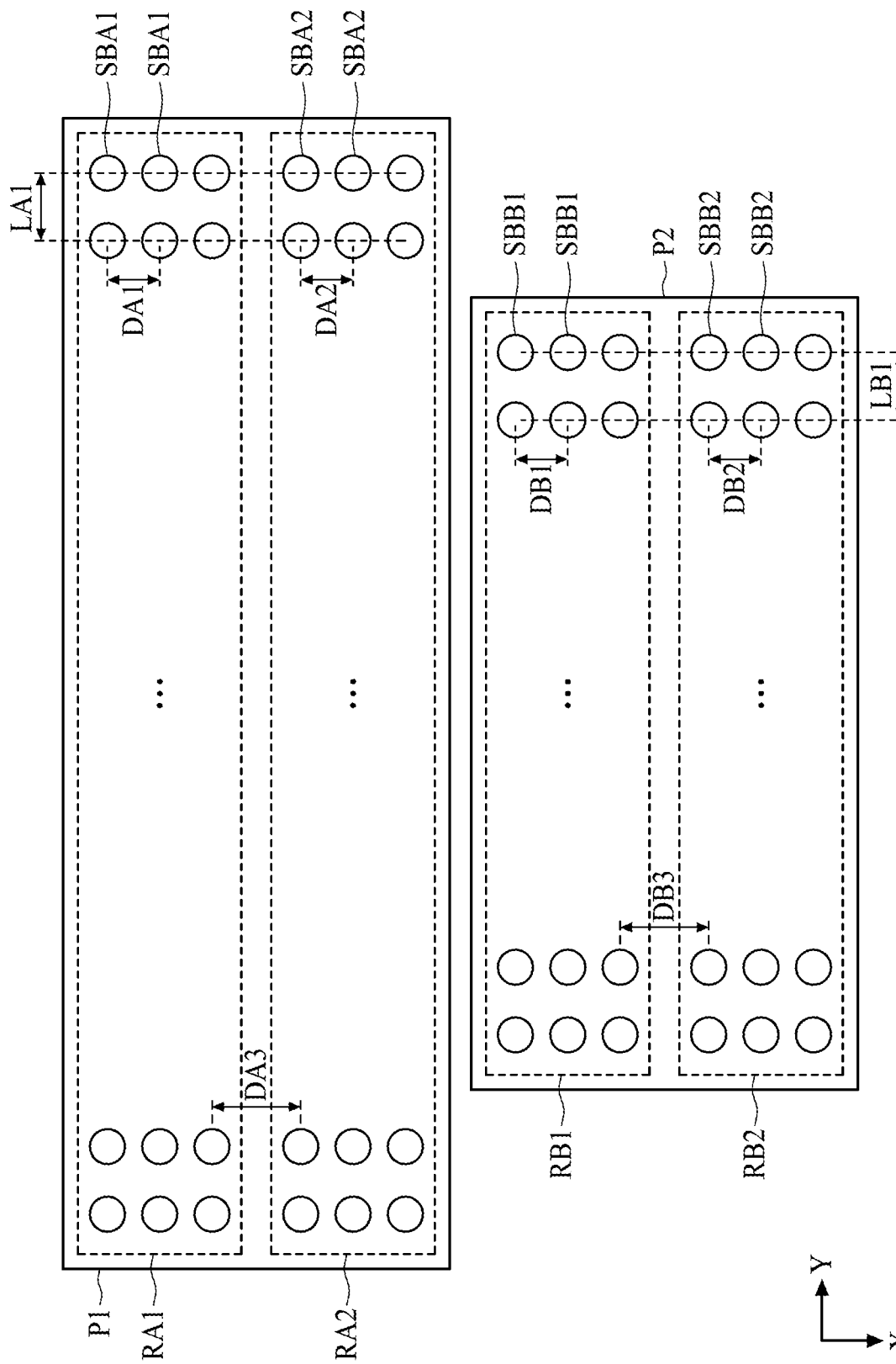
FIG. 7 shows footprints of two common standard packages for DRAM chips defined by the JEDEC.

Furthermore, the JEDEC have defined a variety types of packages that have different ball arrangements. For example, FIG. 7 shows footprints of two common standard packages P1 and P2 for DRAM chips defined by the JEDEC. As shown in FIG. 7, in the package P1, solder balls SBA1 and SBA2 may be disposed in two parallel regions RA1 and RA2. Furthermore, a distance DA1 between two adjacent solder balls SBA1 within the region RA1 and a distance DA2 between two adjacent solder balls SBA2 within the region RA2 are the same. Also, the distance DA1 is smaller than a minimum distance DA3 between two solder balls SBA1 and SBA2 in the two different regions RA1 and RA2 that are adjacent to each other. Correspondingly, the clamp structures 130 can also be arranged in two regions R1 and R2 as shown in FIG. 4, and a minimum distance D6 between boundaries of two closest clamp structures 130 in the two regions R1 and R2 and a distance D7 between centers of two closest clamp structures 130 in the two regions R1 and R2 should also be within predetermined ranges defined by the JEDEC. Consequently, chips having the same package as package P1 can be attached to the chip socket 100 smoothly and stably.

Furthermore, as shown in FIG. 7, the package P1 has a longer length than the package P2, and includes more solder balls along the Y direction. For example, the package P1 may include 96 solder balls in total while the package P2 may include 54 solder balls in total. In the present embodiments, the package P2 have similar solder ball arrangement as the package P1. That is, the pitches of the package P1 are equal to the pitches of the package P2. For example, in the package P2, solder balls SBB1 and SBB2 are disposed in two parallel regions RB1 and RB2. Furthermore, a distance DB1 between two adjacent solder balls SBB1 within the region RB1, and a distance DB2 between two adjacent solder balls SBB2 within the region RB2 are equal to the distance DA1 and DA2. Also, a minimum distance DB3 between two solder balls SBB1 and SBB2 in the two different regions RB1 and RB2 that are adjacent to each other is equal to the distance DA3. In such case, since the pitches of the package P1 are equal to the pitches of the package P2, chips having the same package as package P2 can also be compatible with the chip socket 100 and can be attached to the chip socket 100 smoothly and stably.

In some embodiments, a total quantity of the clamp structures 130 of the chip socket 100 can be greater than or equal to a total quantity of solder balls SBA1 and SBA2 of the package P1 so that multiple chips may be attached to the chip socket 100 along the Y direction at the same time, thereby providing more flexibility for the testing process.

Although FIG. 7 shows the common packages P1 and P2 for DRAM chips, the present disclosure is not limited thereto. In some other embodiments, the clamp structures 130 may have different pitches according to the type of package adopted by the chip to be tested. For example, for some other packages, solder balls may be disposed only in peripheral regions surrounding a center region of the packages. In such case, the clamp structures 130 of the chip socket 100 may have the corresponding arrangement so that chips using such type of package can be attached to the chip socket 100 smoothly and stably.

Figure 8:
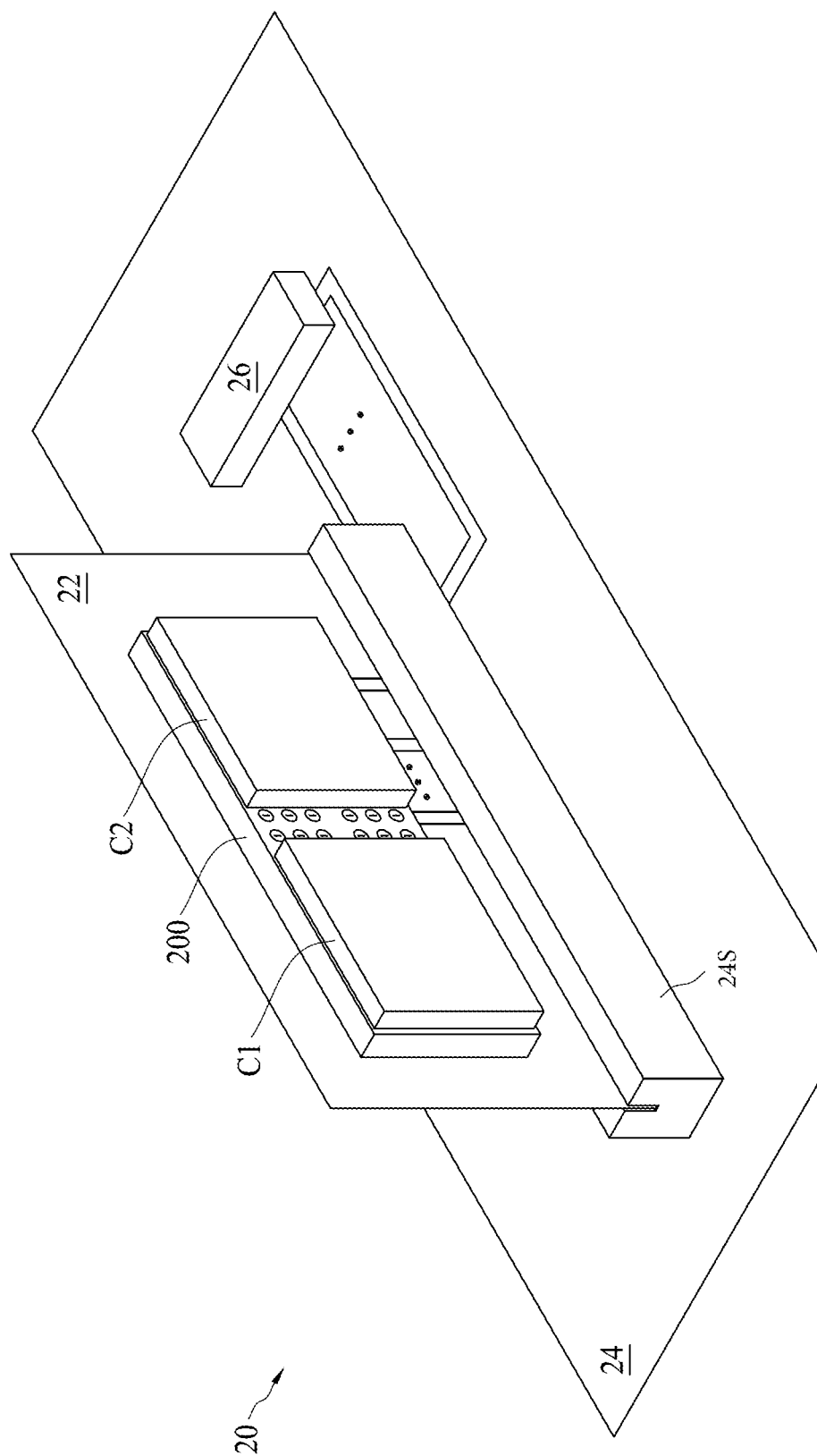
FIG. 8 shows a testing fixture according to another embodiment of the present disclosure.

In the testing fixture 10, the chip socket 100 and the testing circuit 14 can both be mounted on the circuit board 12, however, the present disclosure is not limited thereto. FIG. 8 shows a testing fixture 20 according to another embodiment of the present disclosure. The testing fixture includes a chip socket 200 and circuit boards 22 and 24. The chip socket 200 and the chip socket 100 have similar structures. However, the chip socket 200 can be mounted on the circuit board 22, and the circuit board 22 can be inserted to a slot 24S of the circuit board 24 as a inline memory module, such a single inline memory module (SIMM) or a double inline memory module (DIMM). In such case, the chip C1 attached to the chip socket 200 can be coupled to the circuit board 24 through the chip socket 200 and the circuit board 22, and can be tested by the testing circuit 26 mounted on the circuit board 24. Since the circuit board 22 is swappable in the present embodiment, the testing fixture 20 can provide an even more flexible testing process. Furthermore, in some embodiments, the chip socket 200 may receive more than one chip at the same time. For example, as shown in FIG. 8, the chip C1 and a chip C2 are both attached to the chip socket 200, and the testing circuit 26 may test the two chips C1 and C2 simultaneously or sequentially.

Figure 9:
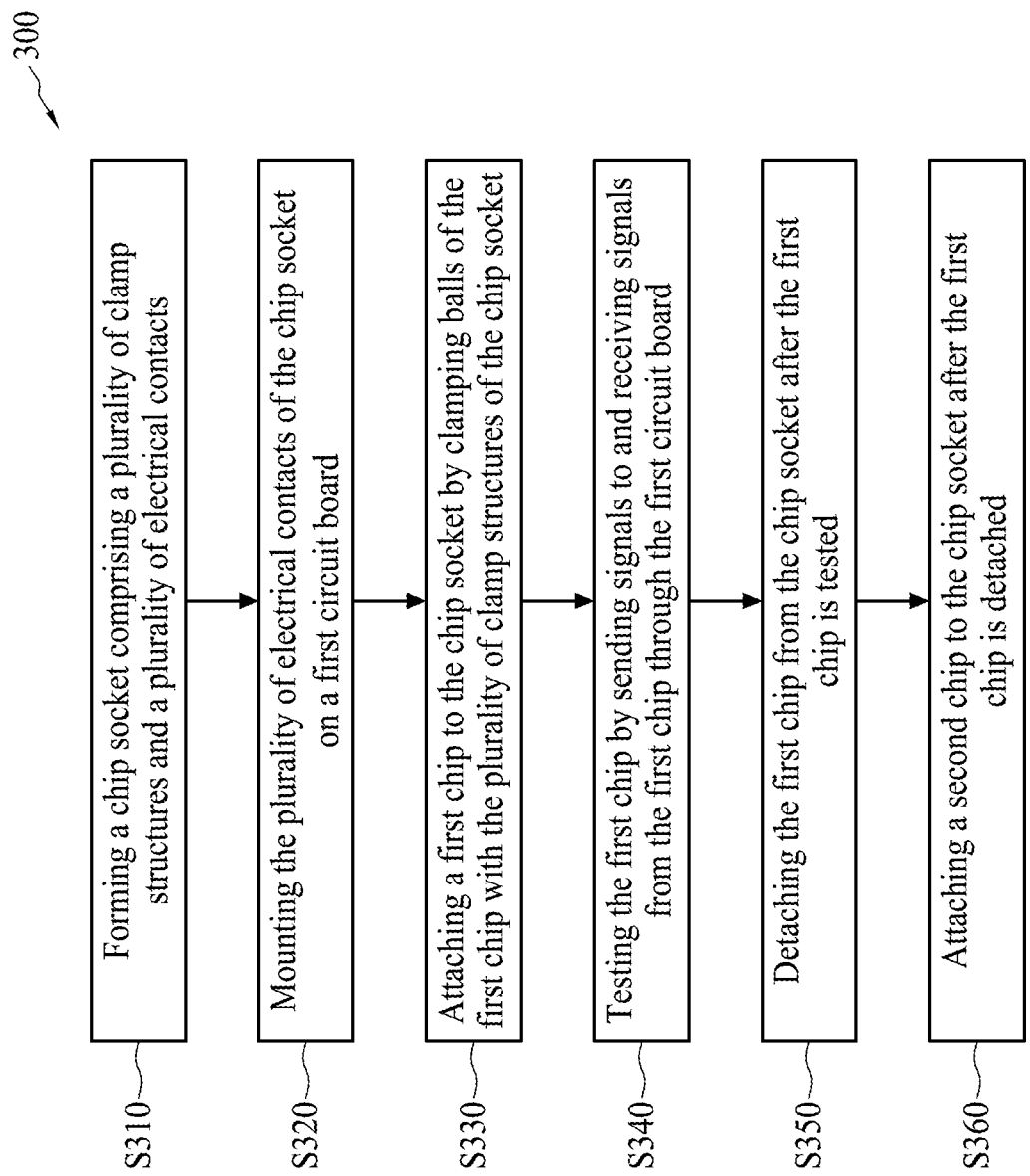
FIG. 9 shows a flowchart of a chip testing method according to one embodiment of the present disclosure.

FIG. 9 shows a flowchart of a chip testing method 300 according to one embodiment of the present disclosure. The chip testing method 300 includes steps S310 to S360. In some embodiments, the chip testing method 300 can be performed with the testing fixture 10. In such case, the chip socket 100 can be formed in step S310, and the chip socket 100 can be mounted on the circuit board 12 with the electrical contacts 140 in step S320. Furthermore, the chip C1 to be tested can be attached to the chip socket 100 by using the clamp structures 130 of the chip socket 100 to clamp the solder balls of the chip C1 in step S330. Consequently, the chip C1 can be tested by sending signals to and receiving signals from the chip C1 through the circuit board 12 in step S340. Furthermore, after the chip C1 is tested in step S340, the chip C1 can be detached from the chip socket 100 in step S350, and a chip C2 can be attached to the chip socket 100 in step S360 so that the chip C2 can also be tested with the chip socket 100.

In some embodiments, the chip socket 100 may have enough clamp structures 130 for receiving multiple chips at the same time. In such case, step S350 may be omitted, and step S360 can be performed with the chip C1 attached to the chip socket 100.

Figure 10:
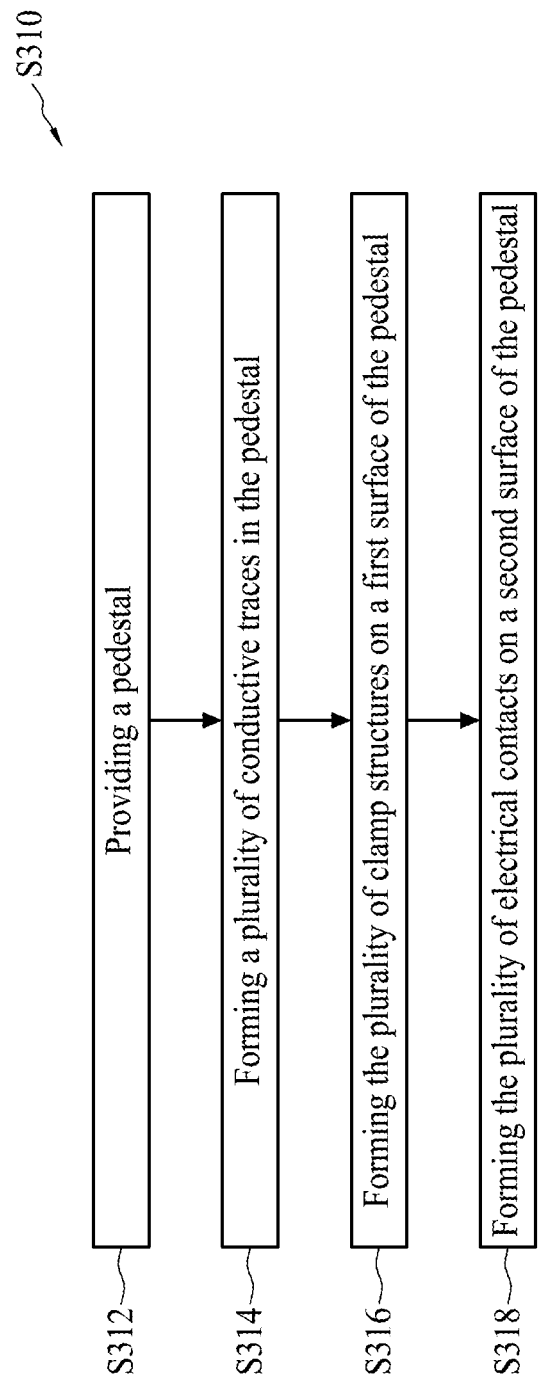
FIG. 10 shows sub-steps for forming the chip socket according to one embodiment of the present disclosure.

FIG. 10 shows sub-steps S312 to S318 of step S310 for forming the chip socket according to one embodiment of the present disclosure. In some embodiments, sub-steps S312 to S318 can used to form the chip socket 100 as shown in FIG. 3. For example, in sub-step S312, a pedestal 110 can be provided, and the conductive traces 120 can be formed in the pedestal 110 in sub-step S314. Also, the clamp structures 130 can be formed on the first surface 112 of the pedestal 110 in sub-step S316, and the electrical contacts 140 can be formed on the second surface 114 of the pedestal 110 in sub-step S318. In some embodiments, the clamp structure 130 can be formed by forming a conductive body 132 embedded in the pedestal 110 and forming a gap 134 in the middle of the conductive body 132. The gap 134 can be surrounded by sidewalls 132W of the conductive body 132, and the gap 134 can accommodate the solder ball SB of the chip C1 while the sidewalls 132W can clamp the solder ball SB as shown in FIG. 6.

Furthermore, in some embodiments, the chip testing method 300 may also be performed with the testing fixture 20. In such case, the chip socket 200 can be formed in step S310 and can be mounted on the circuit board 22 in step S320. Furthermore, the method 300 may further include a step to attach the circuit board 22 to the slot 24S of the circuit board 24 as an inline memory module before the chip C1 can be tested in step S340.

Since the chip socket, the testing fixture, and the chip testing method provided by the embodiments of the present embodiments can use clamp structures on the chip socket to clamp the solder balls of the chip to be tested, the chip to be tested can be attached to the circuit board for testing without being damaged. Furthermore, since the chip socket allows the chips to be attached and detached repeatedly, a repeatable and stable method for testing chip can be provided by the chip sockets and the testing fixtures of the present disclosure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A chip socket comprising:
   a pedestal having a first surface and a second surface;
   a plurality of conductive traces formed in the pedestal;
   a plurality of clamp structures disposed on the first surface of the pedestal, and at least one of the plurality of clamp structures being coupled to a corresponding conductive trace of the plurality of conductive traces and configured to clamp a solder ball of a chip to be tested, wherein the plurality of clamp structures are conductive; and
   a plurality of electrical contacts disposed on the second surface of the pedestal, and at least one of the plurality of electrical contacts being coupled to a corresponding clamp structure of the plurality of clamp structures through a corresponding conductive trace of the plurality of conductive traces;
   wherein the clamp structure of the plurality of clamp structures comprises:
      a conductive body embedded in the pedestal; and
      a gap formed in a middle of the conductive body and surrounded by first and second sidewalls of the conductive body, wherein the first sidewalls are longer than the second sidewalls, the first sidewalls and the second sidewalls are contacted with each other so that the gap includes a closed opening with a first width and a bottom with a second width;
   wherein when the solder ball of the chip to be tested is not inserted into the gap of the clamp structure, the first width of the closed opening of the gap and the second width of the bottom of the gap are identical, the first width of the closed opening of the gap and the second width of the bottom of the gap are smaller than a third width of the solder ball of the chip to be tested;
   wherein when the solder ball of the chip to be tested is inserted into the gap of the clamp structure, the first and second sidewalls surrounding the gap are deformed to increase the first width of the closed opening of the gap to accommodate and clamp the solder ball of the chip to be tested, wherein the first width of the closed opening of the gap is increased to be greater than the second width of the bottom of the gap.

2. The chip socket of claim 1, wherein the conductive body is made of copper or silver.

3. The chip socket of claim 1, wherein pitches of the plurality of clamp structures are compatible with a standard ball grid array (BGA) package defined by Joined Electron Device Engineering Council (JEDEC).

4. The chip socket of claim 3, wherein a total quantity of the plurality of clamp structures is greater than or equal to a total quantity of balls of the standard ball grid array package.

5. A testing fixture comprising:
   a first circuit board; and
   a chip socket mounted on the first circuit board, and the chip socket comprising:
      a pedestal having a first surface and a second surface;
      a plurality of conductive traces formed in the pedestal;
      a plurality of clamp structures disposed on the first surface of the pedestal, and at least one of the plurality of clamp structures being coupled to a corresponding conductive trace of the plurality of conductive traces and configured to clamp a solder ball of a chip to be tested, wherein the plurality of clamp structures are conductive; and
      a plurality of electrical contacts disposed on the second surface of the pedestal, and at least one of the plurality of electrical contacts being coupled to a corresponding clamp structure of the plurality of clamp structures through a corresponding conductive trace of the plurality of conductive traces;
   wherein the clamp structure of the plurality of clamp structures comprises:
      a conductive body embedded in the pedestal; and
      a gap formed in a middle of the conductive body and surrounded by first and second sidewalls of the conductive body, wherein the first sidewalls are longer than the second sidewalls, the first sidewalls and the second sidewalls are contacted with each other so that the gap includes a closed opening with a first width and a bottom with a second width;
   wherein when the solder ball of the chip to be tested is not inserted into the gap of the clamp structure, the first width of the closed opening of the gap and the second width of the bottom of the gap are identical, the first width of the closed opening of the gap and the second width of the bottom of the gap are smaller than a third width of the solder ball of the chip to be tested;
   wherein when the solder ball of the chip to be tested is inserted into the gap of the clamp structure, the first and second sidewalls surrounding the gap are deformed to increase the first width of the closed opening of the gap to accommodate and clamp the solder ball of the chip to be tested, wherein the first width of the closed opening of the gap is increased to be greater than the second width of the bottom of the gap.

6. The testing fixture of claim 5, wherein the conductive body is made of copper or silver.

7. The testing fixture of claim 5, wherein pitches of the plurality of clamp structures are compatible with a standard ball grid array (BGA) package defined by Joined Electron Device Engineering Council (JEDEC).

8. The testing fixture of claim 7, wherein a total quantity of the plurality of clamp structures is greater than or equal to a total quantity of balls of the standard ball grid array package.

9. The testing fixture of claim 5, further comprising a second circuit board, wherein:
   the second circuit board comprises a slot;
   the first circuit board is attached to the slot as an inline memory module; and
   the chip to be tested is coupled to the second circuit through the first circuit board.

10. The testing fixture of claim 5, further comprising a testing circuit mounted on the first circuit board and configured to test a dynamic random access memory circuit in the chip to be tested.

11. A chip testing method comprising:

forming a chip socket comprising a plurality of clamp structures and a plurality of electrical contacts, wherein each of the plurality of clamp structures comprises a conductive body, and a gap formed in a middle of the conductive body and surrounded by first and second sidewalls of the conductive body, wherein the first sidewalls are longer than the second sidewalls, the first sidewalls and the second sidewalls are contacted with each other so that the gap includes a closed opening with a first width and a bottom with a second width, the first width of the closed opening of the gap and the second width of the bottom of the gap are identical, the first width of the closed opening of the gap and the second width of the bottom of the gap are smaller than a third width of one of solder balls of a first chip to be tested;

mounting the plurality of electrical contacts of the chip socket on a first circuit board;

attaching the first chip to the chip socket by inserting the solder balls of the first chip into the gaps of the plurality of clamp structures, increasing the first width of the closed opening of the gap to accommodating and clamping the one of the solder balls of the first chip with the plurality of clamp structures of the chip socket, wherein the first width of the closed opening of the gap is increased to be greater than the second width of the bottom of the gap; and testing the first chip by sending signals to and receiving signals from the first chip through the first circuit board.

12. The chip testing method of claim 11, wherein forming the chip socket comprising the plurality of clamp structures and the plurality of electrical contacts comprises:

providing a pedestal;

forming a plurality of conductive traces in the pedestal;

forming the plurality of clamp structures on a first surface of the pedestal, wherein at least one of the plurality of clamp structures is coupled to a corresponding conductive trace of the plurality of conductive traces; and forming the plurality of electrical contacts on a second surface of the pedestal, wherein at least one of the plurality of electrical contacts is coupled to a corresponding clamp structure of the plurality of clamp structures through a corresponding conductive trace of the plurality of conductive traces.

13. The chip testing method of claim 11, wherein pitches of the plurality of clamp structures are compatible with a standard ball grid array (BGA) package defined by Joined Electron Device Engineering Council (JEDEC).

14. The chip testing method of claim 11, further comprising:

attaching a second chip to the chip socket with the first chip being attached on the chip socket; and testing the second chip by sending signals to and receiving signals from the second chip through the first circuit board;

wherein the first chip and the second chip are tested simultaneously or sequentially.

15. The chip testing method of claim 11, further comprising:

attaching the first circuit board to a slot of a second circuit board as an inline memory module.

16. The chip testing method of claim 11, further comprising:

detaching the first chip from the chip socket after the first chip is tested.

17. The chip testing method of claim 16, further comprising:

attaching a second chip to the chip socket after the first chip is detached;

wherein a total quantity of balls of the first chip is different from a total quantity of balls of the second chip.

* * * * *